(12) United States Patent
Hiatt (10) Patent No.: US 7,833,894 B2
(45) Date of Patent: Nov. 16, 2010

(54) DEVICES AND SYSTEMS HAVING AT LEAST ONE DAM STRUCTURE

(75) Inventor: W. Mark Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 377 days.

(21) Appl. No.: 11/781,746

(22) Filed: Jul. 23, 2007

(65) Prior Publication Data

US 2007/0262424 A1 Nov. 15, 2007

Related U.S. Application Data

(63) Continuation of application No. 11/218,705, filed on Sep. 1, 2005, now Pat. No. 7,772,115.

(51) Int. Cl.
H01L 29/40 (2006.01)
H01L 21/00 (2006.01)
H01L 21/44 (2006.01)

(52) U.S. Cl. ............... 438/598; 438/667; 257/276; 257/502; 257/621

(58) Field of Classification Search ............... 438/598, 438/667; 257/276, 502, 621
See application file for complete search history.

(56) References Cited

U.S. PATENT DOCUMENTS

| | | | |
|---|---|---|---|
| 4,383,363 A | | 5/1983 | Hayakawa et al. |
| 5,229,647 A | * | 7/1993 | Gnadinger ................... 257/785 |
| 5,275,330 A | | 1/1994 | Isaacs et al. |
| 5,404,044 A | * | 4/1995 | Booth et al. ................. 257/698 |
| 5,734,560 A | | 3/1998 | Kamperman et al. |
| 6,076,726 A | | 6/2000 | Hoffmeyer et al. |
| 6,291,779 B1 | | 9/2001 | Lubert et al. |
| 6,300,578 B1 | | 10/2001 | Hoffmeyer et al. |
| 6,362,438 B1 | | 3/2002 | Chong et al. |
| 6,452,117 B2 | | 9/2002 | Curcio et al. |
| 6,467,160 B1 | | 10/2002 | Cummings et al. |
| 6,598,291 B2 | | 7/2003 | Parker, Jr. et al. |
| 6,618,940 B2 | | 9/2003 | Lubert et al. |
| 6,677,237 B2 | | 1/2004 | Umetsu et al. |
| 6,703,310 B2 | | 3/2004 | Mashino et al. |
| 6,734,375 B2 | | 5/2004 | Kawakita et al. |
| 6,809,421 B1 | * | 10/2004 | Hayasaka et al. ........... 257/777 |
| 6,831,000 B2 | | 12/2004 | Murayama |
| 6,903,443 B2 | * | 6/2005 | Farnworth et al. .......... 257/621 |
| 7,091,124 B2 | * | 8/2006 | Rigg et al. ................... 438/667 |
| 7,119,001 B2 | | 10/2006 | Kang |
| 7,211,899 B2 | | 5/2007 | Taniguchi |

(Continued)

*Primary Examiner*—Matthew C Landau
*Assistant Examiner*—James M Mitchell
(74) *Attorney, Agent, or Firm*—TraskBritt (57) ABSTRACT

A method for forming through-wafer interconnects (TWI) in a substrate. Blind holes are formed from a surface, sidewalls thereof are passivated and coated with a conductive material. A vent hole is then formed from the opposite surface to intersect the blind hole. The blind hole is solder filled, followed by back thinning of the vent hole portion of the wafer to a final substrate thickness to expose the solder and conductive material at both the active surface and the thinned back side. A metal layer having a glass transition temperature greater than that of the solder may be plated to form a dam structure covering one or both ends of the TWI. Intermediate structures of semiconductor devices, semiconductor devices and systems are also disclosed.

10 Claims, 9 Drawing Sheets

U.S. PATENT DOCUMENTS

| | | | | |
|---|---|---|---|---|
| 7,232,754 | B2 * | 6/2007 | Kirby et al. | 438/667 |
| 7,345,350 | B2 * | 3/2008 | Sinha | 257/449 |
| 7,358,602 | B2 | 4/2008 | Hara | |
| 7,473,582 | B2 * | 1/2009 | Wood et al. | 438/113 |
| 2002/0084513 | A1 * | 7/2002 | Siniaguine | 257/621 |
| 2002/0105087 | A1 | 8/2002 | Forbes et al. | |
| 2004/0056345 | A1 | 3/2004 | Gilleo | |
| 2004/0161926 | A1 | 8/2004 | Yamaguchi | |
| 2004/0187975 | A1 | 9/2004 | Suemasu et al. | |
| 2004/0212086 | A1 | 10/2004 | Dotta et al. | |
| 2004/0256734 | A1 * | 12/2004 | Farnworth et al. | 257/777 |
| 2005/0064707 | A1 * | 3/2005 | Sinha | 438/667 |
| 2005/0090040 | A1 | 4/2005 | Geng et al. | |
| 2005/0101116 | A1 | 5/2005 | Tseng | |
| 2005/0186770 | A1 * | 8/2005 | Kirby et al. | 438/613 |
| 2005/0186777 | A1 * | 8/2005 | Kirby et al. | 438/629 |
| 2005/0275750 | A1 | 12/2005 | Akram et al. | |
| 2005/0277293 | A1 | 12/2005 | Kim et al. | |
| 2005/0287783 | A1 | 12/2005 | Kirby et al. | |
| 2006/0043154 | A1 | 3/2006 | Kirby et al. | |
| 2006/0097357 | A1 * | 5/2006 | Nemoto | 257/621 |
| 2006/0148250 | A1 | 7/2006 | Kirby | |
| 2006/0177999 | A1 | 8/2006 | Hembree et al. | |
| 2006/0290001 | A1 | 12/2006 | Sulfridge | |
| 2007/0001266 | A1 * | 1/2007 | Arana et al. | 257/621 |
| 2008/0057691 | A1 | 3/2008 | Dando et al. | |

* cited by examiner

DEVICES AND SYSTEMS HAVING AT LEAST ONE DAM STRUCTURE

CROSS-REFERENCE TO RELATED APPLICATION

This application is a continuation of application Ser. No. 11/218,705, filed Sep. 1, 2005, now U.S. Pat. No. 7,772,115, issued Aug. 10, 2010. The disclosure of the previously referenced U.S. patent application is hereby incorporated by reference in its entirety.

FIELD OF THE INVENTION

The present invention relates to semiconductor devices and fabrication methods therefor. More particularly, the invention pertains to methods for forming conductive vias in a substrate such as a semiconductor wafer or other substrate, and resulting structures.

BACKGROUND

Background of Related Art

Semiconductor devices that have integrated circuits are produced by fabricating a large plurality of identical circuit patterns on a semiconductor wafer or other bulk substrates of semiconductor material, wherein each circuit pattern defines a die. A plethora of conventional processes is typically used, including for example, doping, photolithography, layering, etching, laser ablation, metallization, oxidation, layer removal, wafer thinning/planarization, die separation and packaging. Inasmuch as the major goals of semiconductor manufacturers generally typify increased performance and lower cost, considerations such as device density (with concomitant increased circuit speed and reduced power requirements) and enhanced reliability have taken a high priority. In addition, it may be increasingly important that repetitive operations be performed on an entire wafer prior to die separation (singulation), to speed production, reduce production costs, and increase semiconductor device uniformity and reliability and, ultimately, yield.

One way to increase the density of semiconductor devices in a semiconductor assembly is to stack semiconductor dice one upon another. The stacked semiconductor dice may be interconnected by forming conductive vias in through holes in one or more of the semiconductor dice. An interior of each of the vias may be coated with an electrical isolation material followed by an electrically conductive material to electrically connect the vias to integrated circuitry fabricated on an active surface of the semiconductor die and to form a plurality of hollow through-hole vias. Thus, the vias may provide a conductive pathway from the active surface of a semiconductor die to its back surface, enabling interconnection of vias on the back surface, the active surface, or both surfaces of the semiconductor die to external electrical contacts of another semiconductor die or to a carrier substrate. Through holes are typically formed by etching, laser ablation, or a combination thereof. In an etching method, photolithographic patterning of a photoresist is used to define the via locations, followed by wet (chemical) or dry (reactive ion) etching. Laser drilling has been used to form vias by ablating semiconductor material to form through holes extending through the entire thickness of a semiconductor die. The laser-drilled via may then be etched to clean slag from the via and smooth its walls.

Various conductive structures on a die or wafer may be interconnected by a conductive via and further through at least one of bond pads, component leads, metal wires, metal layers, and annular rings. Bond pads on semiconductor dice are typically formed from tungsten, aluminum, copper, or aluminum-copper alloys ranging from 1.5 to 1.0% or less copper. When formed of aluminum, the bond pads may be plated with nickel to deter oxidation and provide a solder-wettable surface. However, a layer of oxide may also form upon nickel, though not as rapidly as aluminum. Such a layer of nickel oxide may present a problem with adhesion or wetting of a molten metal (e.g., solder) thereto.

One of the problems encountered in the use of high density ball grid arrays (BGA), column grid arrays (CGA), or chip scale packaging (CSP) may occur when a through-wafer interconnect (TWI) of a substrate is connected to another substrate such as an electronic module or circuit board. Particularly, when the solder deposited on a bond pad is associated with a hollow conductive via and is heated to a reflow temperature, molten solder may be wicked into the hollow through hole, depleting the ball of sufficient solder to complete the conductive connection.

U.S. Pat. No. 5,275,330 to Isaacs et al. describes a method for improving the connection of hollow through-hole vias in a printed circuit board (PCB) to an electronic module. As shown in this reference, each via is filled step-wise until completely filled with solder, prior to placement and attachment of solder balls of a module. However, multiple pass solder-plugging steps are required and assembly yield may be lower than desired. This method may sometimes result in other problems, including molten/softened solder drainage from the via by gravity or other influences and replacement by solder drawn from the solder ball attachment, compromising the solder ball electrical connection.

As shown in U.S. Pat. No. 6,076,726 to Hoffmeyer et al., it is proposed to plate the cylindrical via with a metal, such as nickel, which may not be wetted effectively by the reflowing of a lead-tin eutectic solder while using fluxes that allow effective wetting to copper. The bond pad of the via is copper plated to effect good wetting to a solder ball. The goal of the reference is to form a hollow (cylindrical) via which is not wettable for solder adhesion, while allowing the bond pad to be wetted by solder.

As described in U.S. Pat. No. 5,734,560 to Kamperman et al., hollow plated through holes in a multi-layer circuit board are capped with a multi-layer cap to prevent the flow of solder into the through holes. The caps comprise a conductive layer attached to one or more insulating layers. The caps are configured in a sheet which may be attached over the field of through holes. However, as an impediment to implementation of such a configuration, cap locations on the sheet must be precisely positioned so as to be aligned with respective through holes.

In U.S. Pat. No. 4,383,363 to Hayakawa et al., a solder paste is used to interconnect the conductive planes on either of a printed circuit board through a via hole. The via hole is not plated and the solder paste is not reflowed. Conductive layers deposited on the substrate and over the via entrap the solder paste within the via hole. Because the solder paste is not reflowed, electrical continuity is established through particle-to-particle contact, which is not always reliable.

There are fundamental differences in forming vias in a circuit board and forming vias in a semiconductor wafer which contains many discrete microchip circuits. While a circuit board is typically manufactured at a desired final thickness, semiconductive materials such as silicon and the like are fragile materials subject to easy fracture. Thus, in contrast to circuit board fabrication, fabrication of electronic devices on an entire semiconductor wafer is typically conducted before the wafer is thinned by a chemical mechanical process (CMP)

or back grinding to a desired final thickness. None of the above referenced patents refer to the formation of a conductive via or TWI in a semiconductor wafer such as comprising a plurality of integrated circuits or the like.

In light of efforts to overcome the disadvantages of the prior art, it may be appreciated that it would be advantageous to develop improved methods for forming TWIs through a semiconductor wafer.

SUMMARY

The present invention comprises methods for making through-wafer interconnects in substrates such as semiconductor wafers and other substrates. The methods include the formation of a conductive through-wafer interconnect, or TWI, having a dam structure at one or both ends. The one or more dam structures may be configured for preventing leakage or loss of solder from the via or TWI during high temperature excursions such as those which typically occur during fabrication, testing and packaging. The one or more dam structures may also provide a convenient base for the attachment of solder balls and the like. Thus, the invention may be useful for enabling column grid array (CGA), ball grid array (BGA) and other types of interconnection between stacked dice or stacked circuit boards, and/or in die-to-circuit board attachments. The present invention may also be useful for simply connecting active area bond pads to back-side conductors. Interconnects so formed may be fabricated in the wafer stage of manufacture, utilizing conventional wafer thinning techniques. At least one semiconductor die including a TWI and having at least one dam structure is encompassed by the present invention, as well as systems incorporating same.

One embodiment of a method of the present invention is generally described, infra, by the formation of at least one TWI in a substrate such as a semiconductor wafer in an intermediate stage of manufacture. Thus, at least one TWI may be formed following the creation of multiple identical integrated circuits (IC), including bond pads, on the active surface of the wafer. However, the methods may be utilized to form at least one TWI at any stage prior to the creation of multiple identical integrated circuits (IC) and bond pads on the active surface of the wafer. The methods of the invention may also be used to form at least one TWI in substrates without passing through a bond pad. The invention also includes electronic apparatuses and systems having at least one semiconductor die including at least one through-wafer interconnect comprising at least one dam structure.

In accordance with the invention, a plurality of TWIs may be formed in a substrate (e.g., a semiconductor wafer). Particularly, locations of a plurality of through-wafer interconnects may be selected for forming at least partially into the substrate. Further, a plurality of blind holes may be formed through any overlying structure (oxide, bond pads, etc.) into the substrate wherein a depth of each of the plurality of blind holes extends into the substrate at least to a final desired thickness thereof. Additionally, optionally, a passivation layer may be desirably applied upon the sidewalls and blind ends of the blind holes and a metal-wettable layer may be applied over the passivation layer within the blind holes. A plurality of vent holes may be formed from the opposite surface into which the plurality of blind holes are formed and may at least partially intersect the blind holes and form through holes. Also, molten solder may be deposited within the metal-wettable layer (blind hole portion) of the through holes and solidified. Put another way, an intermediate structure for fabricating a plurality of semiconductor devices is encompassed by the present invention. Particularly, such a semiconductor wafer may include a first surface and a second surface and a plurality of recesses formed into the substrate from the first surface. Further, the semiconductor wafer may include a plurality of vent holes extending from the second surface, wherein each of the plurality of vent holes at least partially intersects with a respective recess of the plurality of recesses and wherein each of the plurality of recesses is substantially filled with solder and each of the plurality of vent holes is substantially devoid of solder. The substrate may be thinned to a desired final substrate thickness as by back grinding, removing at least the vent holes and a portion of the substrate material underlying the recesses and forming solder-filled, through-wafer interconnects.

In a further aspect of the invention, at least one dam structure may be formed over at least one end of a via or TWI by electroless plating of a metal such as nickel or copper over at least one solder-filled metal end of the through holes, forming at least one cap or dam structure which may prevent drainage of solder therefrom during elevated temperatures at which solder melts. The exposed surface of the at least one dam structure may be photoresist etched to form a solder-retaining pattern to which a connector (e.g., solder ball) may be securely attached. The at least one dam structure may also be used to keep dissimilar materials located on either side thereof separated, and eliminate cross-contamination concerns. Accordingly, at least one semiconductor die or semiconductor die precursor structure (e.g., a semiconductor wafer) may be formed. Further, such a semiconductor die may be incorporated within a semiconductor device or system. For example, the methods of the invention may be particularly advantageous in the production of die-stacked devices, such as stacked DRAMs, SRAMs, PCRAMs, MRAMs, CAMs, flash memory devices, imagers, and the like. The method is also useful for simply connecting conductors on opposing surfaces of a thinnable substrate.

The methods of the invention offer substantial advantages over the prior art. The methods may solve the problems of solder leakage and may reduce an occurrence of unwanted voids in the solder. Reflow induced solder connection of a device (or wafer of devices) to another adjacent substrate or circuit board, etc., may be readily conducted without fear of solder loss at the elevated temperatures. The methods may be advantageous for enabling the production of high-density TWI arrays. Furthermore, all of the actions of the methods of the present invention may be conducted at a semiconductor wafer stage, whereby each action of the methods may simultaneously encompass all of the individual devices on the semiconductor wafer.

Other features and advantages of the present invention will become apparent to those of skill in the art through consideration of the ensuing detailed description, the accompanying drawings, and the appended claims. The drawings are idealized representations for better illustration of the methods of the invention, and various elements are not necessarily shown to scale.

BRIEF DESCRIPTION OF THE SEVERAL VIEWS OF THE DRAWINGS

In the drawings, which depict exemplary embodiments of various features of the present invention.

DETAILED DESCRIPTION

The invention comprises methods for forming through vias (TVs) or through-wafer interconnects (TWIs) through a substrate structure. The term "via" is a general term denoting a conductor passing through a substrate structure. The term "through-wafer interconnect" is often used more specifically where the substrate structure is a wafer of semiconductor material (e.g., a semiconductor wafer). In this application, the terms "substrate" and "wafer" will be used interchangeably as encompassing any substrate material which may be subjected to a thinning process for reducing its thickness. Thus, the methods of the present invention relate to semiconductor devices whether in the wafer form or individualized die form that are thinnable to a final thickness. Accordingly, the term "substrate" refers not only to silicon wafers (e.g., monocrystalline silicon or polycrystalline silicon) but may also refer to silicon on insulator (SOI) substrates, silicon on sapphire (SOS) substrates, silicon on glass (SOG) substrates, epitaxial layers of silicon on a base semiconductor foundation, and other materials as known in the art, such as gallium arsenide, diamond, silicon-germanium, germanium, ruby, quartz, sapphire, silicon carbide and indium phosphide. Thus, the present invention may relate to semi-conductive or non-conductive substrates, without limitation.

It will be understood that methods for wafer fabrication and packaging which precede and follow the methods described herein are generally known to those of ordinary skill in the art and, thus, are not described apart from the context of the invention. Also, while the drawings show a single TWI 20 (see, for example, FIGS. 15 through 17) for clarity and simplicity it is understood that the present invention contemplates any number (e.g., a plurality) of TWIs may be formed within a substrate. Thus, hundreds or even thousands of TWIs may be formed within a single wafer or substrate (e.g., a semiconductor wafer).

Figure 2:
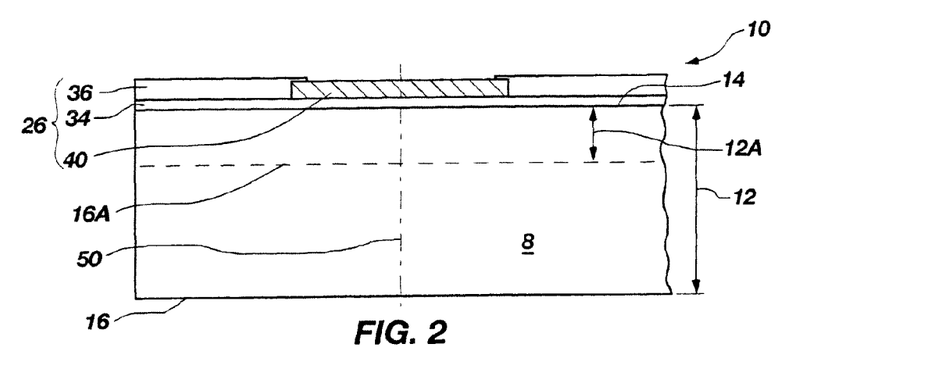
FIG. 2 is a cross-sectional side view of a portion of an exemplary substrate structure in which a TWI is to be formed in accordance with the invention.

For example, as shown in FIG. 2, where the substrate structure 10 is an unseparated plurality of semiconductor devices in wafer form, the first surface 14 (e.g., active surface) of the substrate structure 10 may be typically covered with a first oxide layer 34, as known in the art. The first oxide layer 34 may be a silicon oxide layer, such as a layer of silicon dioxide ($SiO_2$), phosphorus silicon glass (PSG), borosilicate glass (BSG), borophosphosilicate glass (BPSG) or spin-on dielectric (SOD).

First oxide layer 34 on a first substrate surface 14 is shown in FIG. 2 as being partially covered by a first passivation layer 36. This first passivation layer 36 may be typically formed from silicon dioxide, silicon nitride, silicon oxynitride, BPSG, PSG, BSG, polyimide, benzocyclobutene, mixtures thereof, or other dielectric materials as known in the art. For example, the first passivation layer 36 may include at least one layer of both $SiO_2$ and SiN (e.g., a so-called sandwich structure), as known in the art. Also, the first passivation layer 36 may typically have a thickness of about 0.1 µm to 10 µm. Further, the first oxide layer 34, electronic circuitry (not shown) terminating in bond pads 40, and first passivation layer 36 may be formed on the bulk substrate material 8 prior to formation of a TWI 20 (shown in FIGS. 14 and 15) according to the present invention.

Figure 1:
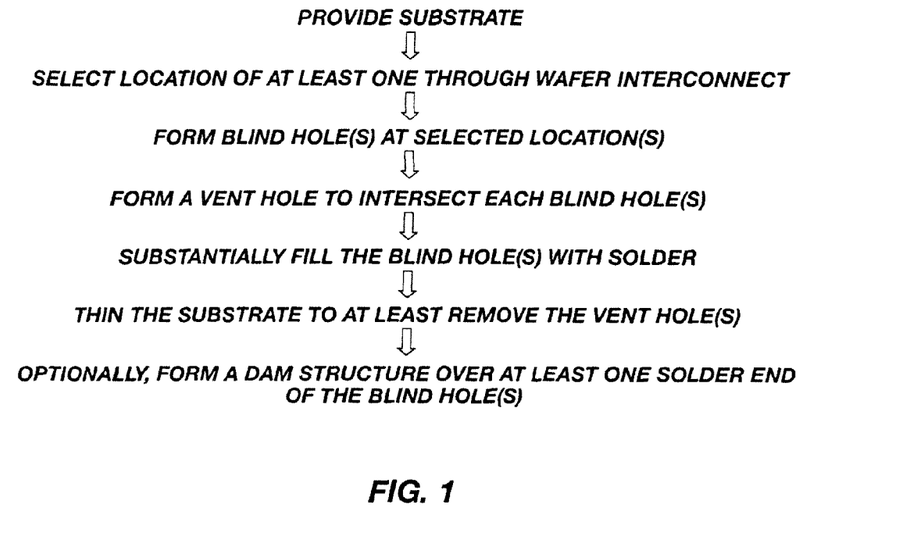
FIG. 1 is a flowchart showing one embodiment of a general method for producing a through-wafer interconnect (TWI) in a substrate in accordance with the invention.

One method of the present invention is generally outlined in FIG. 1 and illustrated in FIGS. 2 through 16, and relates to a substrate structure 10 which may be an exemplary multi-die semiconductor wafer residing on bulk substrate 8. However, the method outlined in FIG. 1 does not explicitly show every action encompassed therein. For example, various cleaning actions are not shown, but are well-known to those of one of ordinary skill in the art.

Generally, the present invention contemplates that a plurality of bond pads formed on a first surface of a substrate may be electrically joined by TWIs to a second surface thereof. Furthermore, the substrate structure or wafer may be thinned from an initial thickness to a selected final thickness. It should be understood that the particular processes, materials, or combinations thereof employed for accomplishing individual actions may vary, resulting in many embodiments. A discussion of specific preferred embodiments follows, including references to exemplary variations and additions, among others, which may be, optionally, applied to the basic methods of the present invention.

Figure 3:
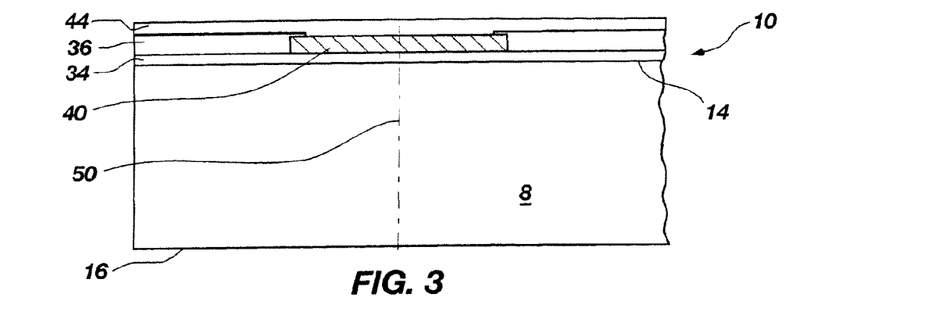
FIG. 3 is a cross-sectional side view of the exemplary substrate structure of FIG. 2 following application of a photoresist layer in accordance with one embodiment of the invention.

As indicated in FIGS. 2 and 3, a substrate structure 10 may be provided from bulk substrate 8 having an initial thickness 12 defined between first surface 14 and second surface 16. Initial thickness 12 may be reduced to a selected final thickness 12A, which may correspond to a depth to which TWIs are selected to extend. Of course, optionally, substrate structure 10 may be thinned from first surface 14, if desired, without limitation, if it is devoid of structures thereon which would be damaged thereby. The present invention contemplates a method for forming at least one TWI 20 (shown in FIGS. 14 and 15) passing from the first surface 14 to a thinned second surface 16A of the substrate structure 10, for electrical connection therebetween. The location(s) of the desired TWI(s) 20 are selected or determined and preferably may be pre-programmed into process control software for automated formation of blind holes 18 in the first surface 14. In the example depicted in the figures, a TWI 20 may be located so as to at least partially intersect with bond pad 40 on the first surface 14 (i.e., active surface). Accordingly, in one embodiment, it may be desirable to select a position for forming a TWI 20 which generally centers a cross-sectional area intersecting bond pad 40 with respect to a center of bond pad 40. Put another way, a centroid of a cross-sectional area of a TWI 20 may be substantially aligned with a centroid of a cross-sectional area of a bond pad.

Figure 5:
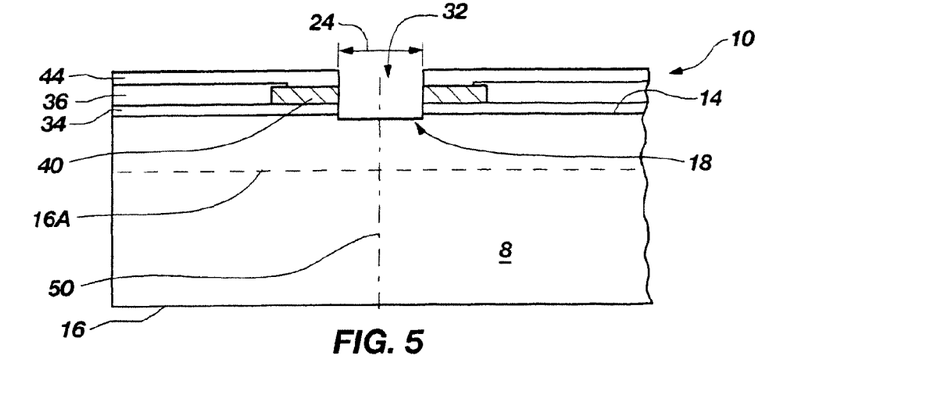
FIG. 5 is a cross-sectional side view of the exemplary substrate structure of FIG. 4 following formation of a blind hole through a bond pad and oxide layer, in accordance with an embodiment of the invention.

Referring to FIG. 5 and as mentioned hereinabove, a blind hole 18 may be formed generally through at least a portion of bond pad 40 or may be positioned as otherwise desired. For example, a plurality of blind holes 18 may have openings 32 which may be typically located in an array (not shown) on the first surface 14. Blind hole 18 may be formed by any method which may accurately form a blind hole of a desired shape, depth 22 (FIG. 6) and width 24 into bulk substrate 8 of substrate structure 10 and through any overlying structure 26 (FIG. 2). Thus, a blind hole 18 with an opening 32 may be formed by laser drilling or ablation, conventional dry etch chemistries such as a reactive ion etch, conventional wet etch chemistries, mechanical drilling, combinations thereof, or by any other process for forming recesses in a substrate structure 10. A combination of processes or treatments may be utilized, particularly where overlying structure 26 includes at least one of passivation materials, conductive bond pads, and a photoresist layer. In the illustrated example shown in FIGS. 3 through 5, the blind hole 18 may be formed at least partially through a bond pad 40, an underlying first oxide layer 34, and into a portion of the bulk substrate 8.

Figure 4:
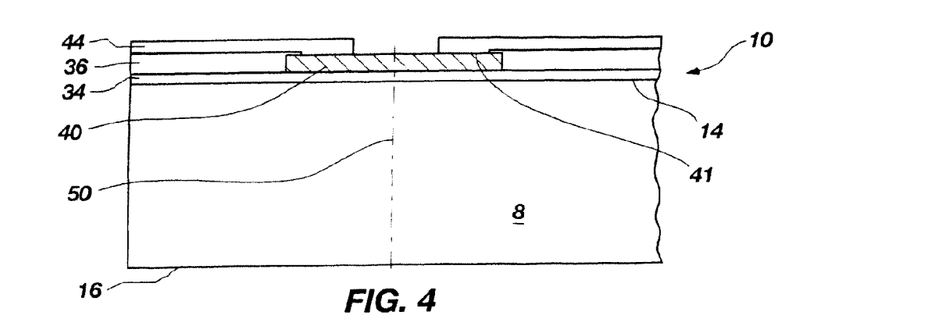
FIG. 4 is a cross-sectional side view of the exemplary substrate structure of FIG. 3 following etching a hole pattern through the photoresist layer, in accordance with one embodiment of the invention.

Although blind hole 18 may be formed by any of a variety of ways, the exemplary method shown in FIGS. 3 through 7 is a combination of several different methods. As shown in FIG. 3, a photoresist layer 44 is formed to cover the bond pads 40 and surrounding region. The photoresist layer 44 is then patterned, as shown in FIG. 4, to establish the blind hole 18 location and size, as known in the art. As depicted in FIG. 5, an initial etch may be conducted through bond pads 40 using a conventional anisotropic (dry) etch or an isotropic (wet) etch chemistry. Then, an anisotropic etch may be conducted to extend the blind hole 18 through first oxide layer 34 and into bulk substrate 8 with, for example, a Bosch type ($SF_6$, $C_2F_4$) etch chemistry or other suitable etch chemistry. The blind hole 18 may be further deepened by either additional etching or laser ablation to the depth 22 shown in FIG. 6. The depth 22 of blind hole 18 (from first surface 14) may be at least equal to, and preferably slightly greater than, a desired final thickness 12A of bulk substrate 8 and may, by way of example only, exhibit a width or diameter 24 of approximately 50 µm or less.

Figure 8:
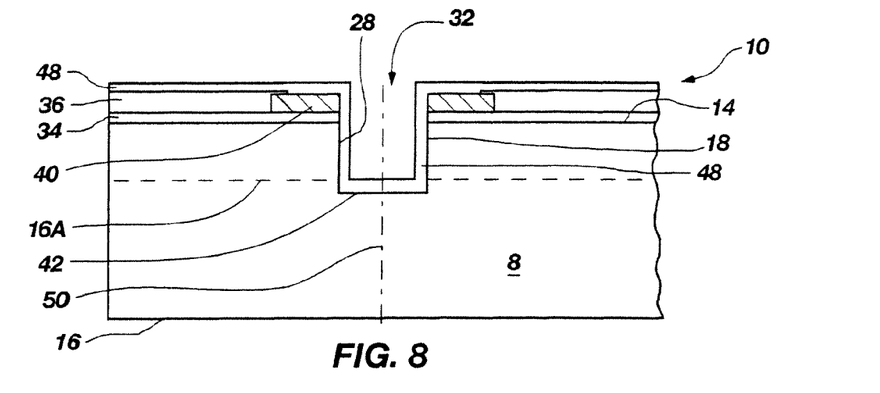
FIG. 8 is a cross-sectional side view of the exemplary substrate structure of FIG. 7 following application of a passivation layer in the blind hole, in accordance with the invention.

As shown in FIG. 8, in order to electrically isolate the TWI 20 (FIGS. 15-17) from the bulk substrate 8, a passivation layer 48 may be formed upon the sidewalls 28 of the blind hole 18 which is deposited or formed (e.g., by oxidation of a portion of bulk substrate 8) by methods well known in the art. Such methods may include, by way of example and without limitation, physical vapor deposition (PVD), atomic layer deposition (ALD), chemical vapor deposition (CVD), low pressure chemical vapor deposition (LPCVD), rapid thermal nitridation (RTN), a spin-on-glass (SOG) process, flow coating or any other known process. Passivation layer 48 may be formed by oxidation of the semiconductor material surface (e.g., silicon) and may comprise any of a pulse deposition layer comprising aluminum-rich oxide, silicon dioxide, silicon nitride, or silicon oxynitride, a glass (i.e., borophosphosilicate glass, phosphosilicate glass, or borosilicate glass), a polymer such as PARYLENE™, benzocyclobutene (BCB) or any dielectric material having a sufficiently low dielectric constant known in the art. Accordingly, the passivation layer 48 may be, for example, silicon dioxide or other oxide, an organic coating or other electrically insulative material. For example, passivation layer 48 may comprise a layer of low stress or low silicon oxide (LSO) deposited at a thickness ranging from about 0.1 µm to about 5 µm, and more generally approximately 1 to 2 µm. Passivation layer 48 is depicted in FIG. 8, wherein a deposition method has also covered other surfaces of the substrate structure 10, as well as the blind end 42 of blind hole 18. As shown, the first passivation layer 36 adjoins the first oxide layer 34 to form a continuous covering within the blind hole 18, electrically insulating the blind hole 18 from the semiconductive material of bulk substrate 8.

Figure 9:
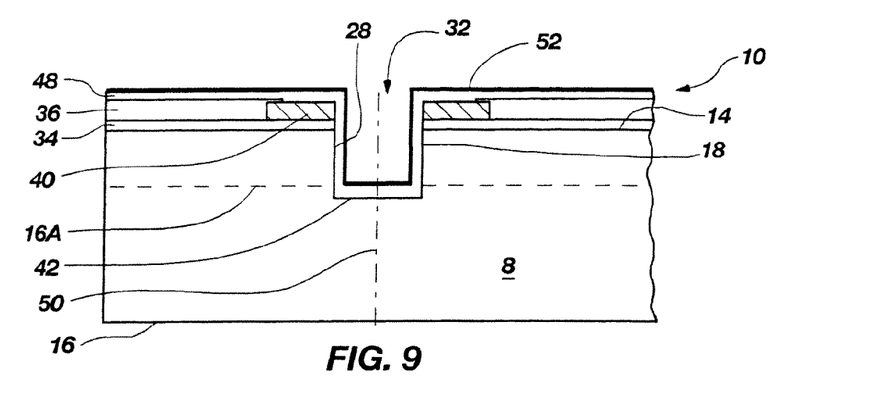
FIG. 9 is a cross-sectional side view of the exemplary substrate structure of FIG. 8 following application of a metallic seed layer over the passivation layer, in accordance with an embodiment of the invention.
Figure 11:
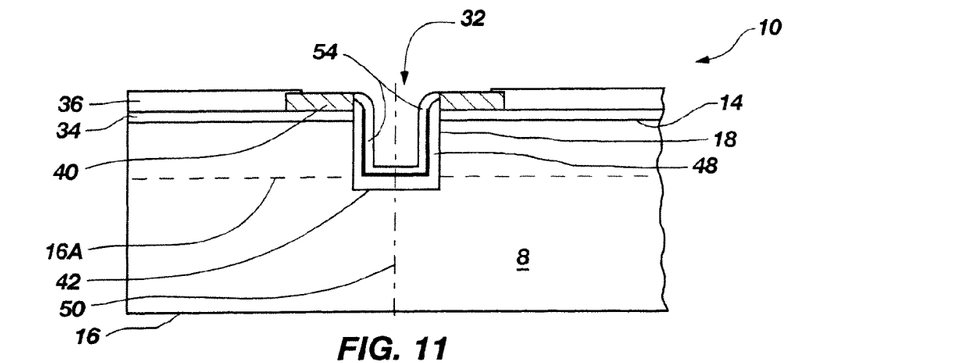
FIG. 11 is a cross-sectional side view of the exemplary substrate structure of FIG. 10 following plating of a solder-wetting metal over the passivation material within the blind hole, in accordance with the invention.

As shown in FIG. 11, a conductive layer 54 may be deposited within the blind hole 18. For example, conductive layer 54 may be deposited within blind hole 18 by, for example, electroless plating, electroplating or any other suitable technique. In order to enhance coverage of conductive layer 54, especially in very small TWIs 20, a relatively thin seed layer 52, as known in the art, may be deposited upon the passivation layer 48, as depicted in FIG. 9. This seed layer 52 may be any material which enhances the adhesion of a deposited (e.g., electroless) metal thereto. For example, a seed layer 52 of copper or tantalum may be subsequently plated with a metal, such as copper or nickel to form conductive layer 54. Other metals or metal salts may be utilized as seed materials as known in the art. Typically, the seed layer 52 has a thickness of about 0.5 µm to 2 µm and may comprise one or both of tantalum (Ta) or copper (Cu) deposited as a pulse deposition layer (PDL) of about 1 µm thickness. The seed layer 52 may be discontinuous.

Figure 10:
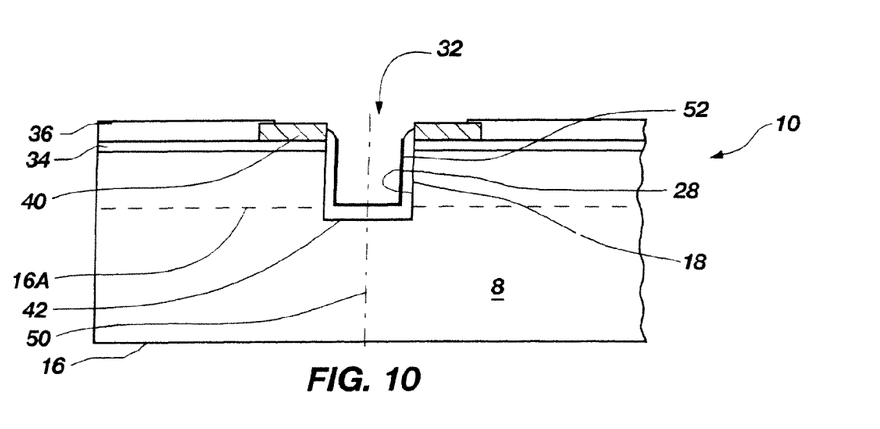
FIG. 10 is a cross-sectional side view of the exemplary substrate structure of FIG. 9 following removal of extraneous passivation material external to the blind hole, in accordance with the invention.

Following deposition of the seed layer 52, the seed layer 52 and underlying passivation layer 48 may be removed (e.g., as by etching) from the exterior of substrate structure 10 and from bond pad surfaces 41, as shown in FIG. 10. Where it is desired to electrically connect the TWI 20 to the bond pad 40, the uppermost portion of the seed layer 52 and underlying passivation layer 48 proximate the bond pad 40 may also be removed, as shown in FIG. 10, so as to expose an inner side portion of the bond pad 40 surrounding blind hole 18 so that an electrically conductive, solder-wetting layer (e.g., conductive layer 54 as shown in FIG. 11) applied thereon will form electrical contact therewith.

Thus, as depicted in FIG. 11, a conductive layer 54 may be formed (e.g., electroplated or electroless plated) over the seed layer 52 within an interior of the blind hole 18 and may be solder-wetting. For example, conductive layer 54 may comprise copper or nickel and may exhibit a layer thickness of about 5 µm or less. Typically, a layer thickness of conductive layer 54 may be approximately 3 µm or less. Methods for metal deposition are well known in the electronics art. In an exemplary electroless plating of nickel over a seed layer 52 for forming conductive layer 54, the substrate structure 10 may be first cleaned and then immersed in a bath containing the electroless nickel plating solution to form a conductive layer 54 comprising nickel. Thus, the conductive layer 54 may act as a wetting layer enabling molten solder to more effectively fill the blind hole portion of the TWI 20. A wide variety of electroless nickel plating solutions are known in the art, such as electroless nickel-phosphorus plating solutions or electroless nickel-boron plating solutions.

For example, electroless nickel plating solutions are commercially available, such as NicPac 2.1, NicPac 2.2, and NicPac 2.3, which are available from PacTech GmbH (Berlin, Germany); and RONAMAX® SMT, DURAPOSIT®, NIPOSIT®, NIPLATE™, which are available from Rohm & Haas Electronic Materials (Philadelphia, Pa.) Such electroless nickel plating solutions may include nickel salts such as nickel sulfate, nickel chloride, nickel bromide, nickel fluoroborate, nickel sulfonate, nickel sulfamate, and nickel aryl sulfonates, as a source of nickel ions. Also, as known in the art, an electroless nickel solution may also include a reducing agent, an alkali for pH control, and complexing agents. During electroless plating, nickel ions are reduced to nickel by oxidation of the reducing agent. The nickel plating solution may be maintained at a temperature range from about 60° C. to about 100° C. A concentration of nickel ions in the electroless plating solution, the plating temperature, and the time of exposure (immersion time) may be selectively controlled to provide a desired thickness of conductive layer 54 on the sidewalls 28 and blind end 42.

Figure 12A:
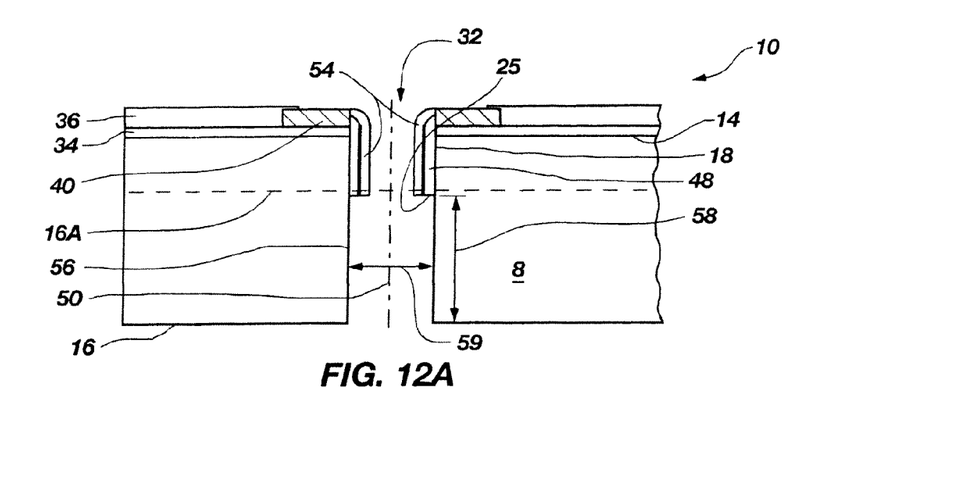
FIG. 12A is a cross-sectional side view of the exemplary substrate structure of FIG. 11 following formation of a vent hole from the back side of the substrate structure to intersect the blind hole and create a through hole, in accordance with the invention.

As shown in FIG. 12A, a vent hole 56 may be formed from the second surface 16 to the blind hole 18. Generally, vent hole 56 may at least partially intersect with blind hole 18. As shown in FIG. 12A, vent hole 56 may extend a distance 58 from the second surface 16 and into the blind end 42 and portions of layers 48, 52 and 54 which overlie the blind end 42. Thus, blind hole 18 and vent hole 56 may, in combination, form an interconnected through-hole extending between the first surface 14 and the second surface 16.

Figure 12B:
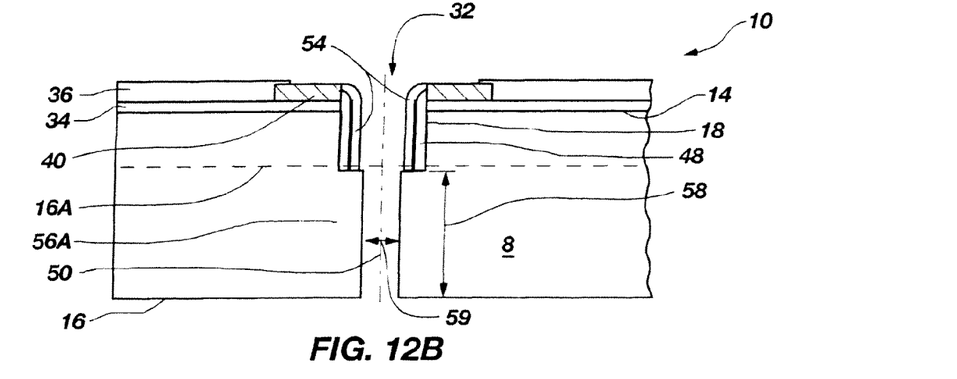
FIG. 12B is a cross-sectional side view of another exemplary substrate structure of FIG. 11 following formation of a vent hole from the back side of the substrate structure to intersect the blind hole and create a through hole, in accordance with the invention.

Optionally, the vent hole 56 may intersect the blind end 42 of blind hole 18 coaxially along central axis 50. Also, optionally, as shown in FIG. 12B, vent hole 56A may be sized (e.g., in diameter) smaller than a cross-sectional size (e.g., a diameter) of blind hole 18, if desired. Generally, the vent hole 56A may have any vent hole diameter 59 suitable for permitting the escape of gases without interfering with molten solder at least substantially or completely filling the blind hole 18. Put another way, the blind hole 18 and the vent hole 56A may be structured so that introducing solder into the blind hole 18 generally from the first surface 14 causes gas within the blind hole 18 to flow at least into the vent hole 56A and toward the second surface 16.

Figure 12C:
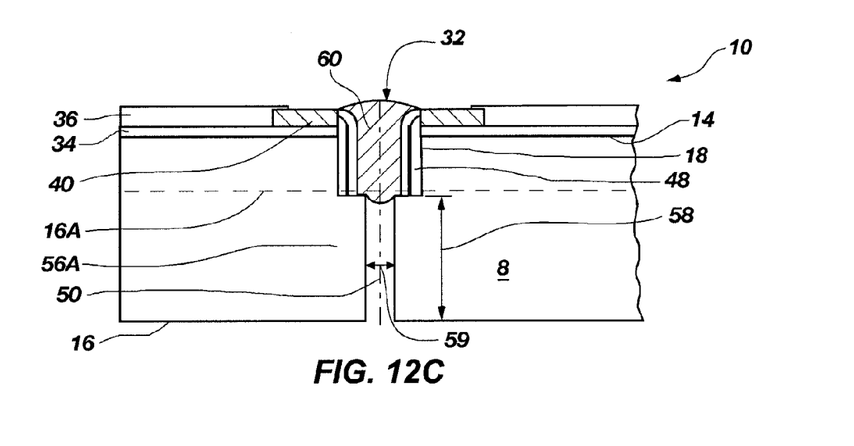
FIG. 12C is a cross-sectional side view of the vent hole configuration shown in FIG. 12B, including solder deposited within the blind hole.
Figure 12D:
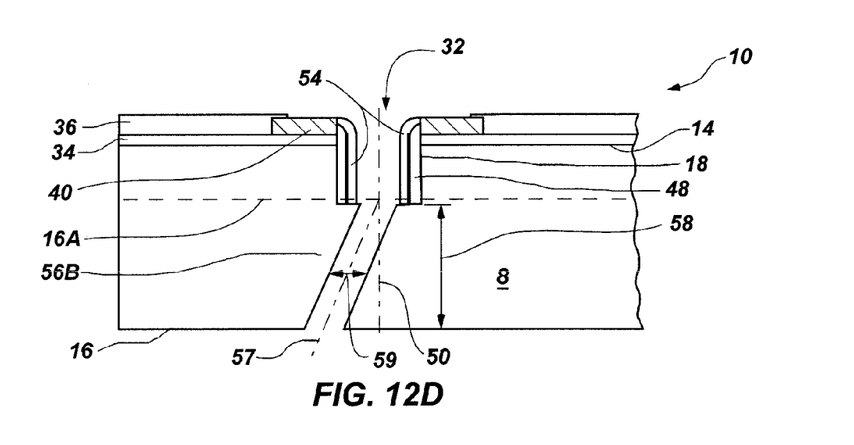
FIG. 12D is a cross-sectional side view of a further exemplary substrate structure of FIG. 11 following formation of a vent hole from the back side of the substrate structure to intersect the blind hole and create a through hole, in accordance with the invention.

Further, a vent hole may be sized so that a surface tension of a molten solder impedes introduction thereof within the vent hole while being suitably sized for permitting the escape of gases from blind hole 18. Particularly, FIG. 12C shows a vent hole 56A that is sized so that the surface tension forces of the solder 60 (note arcuate surface of solder protruding partially within vent hole 56A) inhibits introduction of the solder 60 (when molten) into the vent hole from the blind hole 18. Other factors such as manufacturing time for forming a plurality of vent holes 56A, heat generated, if any, or ease in locating the vent hole 56A in relation to the blind hole 18 may be considered in selecting a size, orientation, and structure for a vent hole. In a further alternative, as shown in FIG. 12D, a vent hole 56B (i.e., a central axis 57 thereof) may intersect the blind end 42 of blind hole 18 at an incident angle (with respect to central axis 50) of up to about 45 degrees (not shown).

Figure 13:
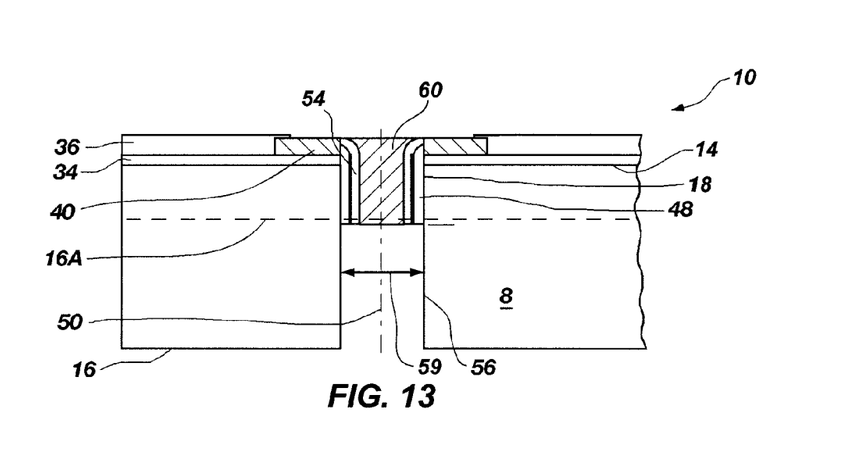
FIG. 13 is a cross-sectional side view of the exemplary substrate structure of FIG. 12A following solder fill into the metal plated portion of the through hole, in accordance with the invention.

Alternatively, as shown in FIGS. 12A and 13, the vent hole diameter 59 may be approximately equal to the blind hole width or diameter 24, shown in FIG. 5. If the vent hole 56 is formed with a vent hole diameter 59 equal to or greater than the blind hole width or diameter 24, the blind hole 18 will be exposed at the intersection 25 of the vent hole 56 and the blind hole 18. The vent hole 56 opens up the blind end 42 to ensure that solder 60 will fill blind hole 18 without forming voids. Such voids may occur when attempting to fill blind holes with solder, particularly blind holes having relatively high aspect ratios (i.e., long, slender or small diameter blind holes).

Various methods may be used for forming the vent hole 56, including laser drilling or ablation, dry etching (e.g., reactive ion etching), photochemical etching, masking and anisotropic etching, mechanical drilling, or other processes which will form openings in semiconductor (and other) substrate structure 10. Each of these methods may be utilized to produce blind holes, through holes, or combinations thereof in substrates, as known in the art. Regardless of the method used to form the vent hole 56, the vent hole 56 and blind hole 18 may generally require cleaning prior to at least partially filling blind hole 18 of the TWI 20 with solder 60. A currently preferred method for forming a vent hole 56 of small diameter (e.g., less than about 50 µm), of high aspect ratio (e.g., greater than about 1), or combinations thereof is laser ablation. In such an instance, a 6% tetramethyl ammonium hydroxide (TMAH) in propylene glycol solution may be used to clean the vent hole 56.

Figure 6:
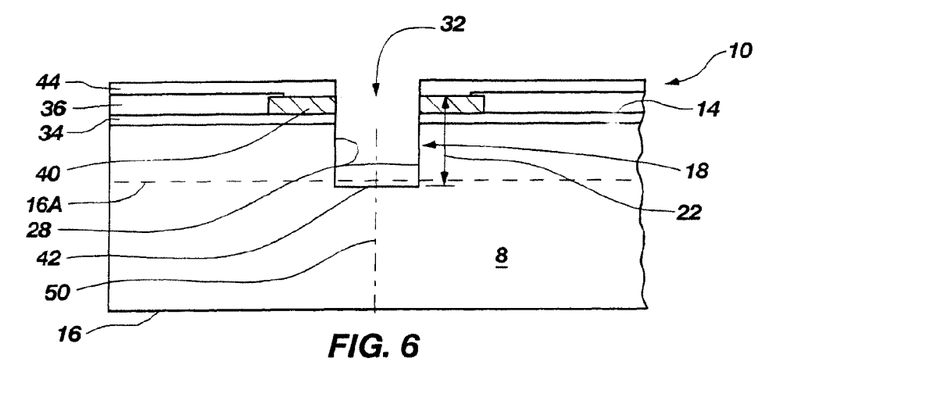
FIG. 6 is a cross-sectional side view of the exemplary substrate structure of FIG. 5 following extension of the blind hole into the bulk substrate material, in accordance with one embodiment of the invention.
Figure 7:
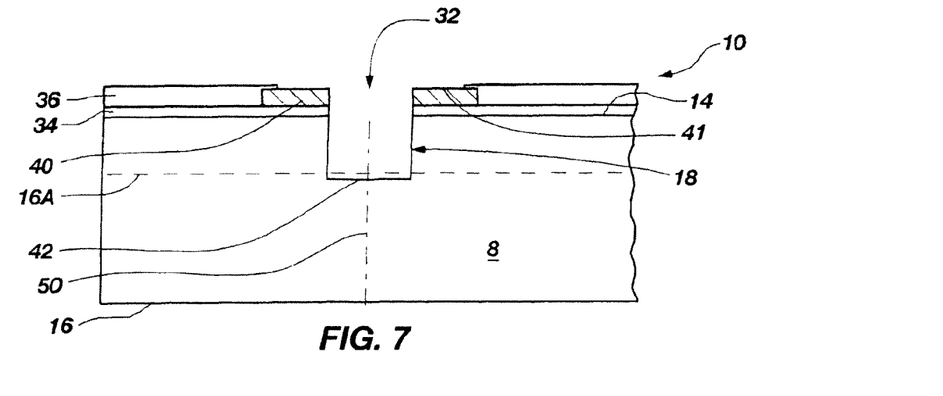
FIG. 7 is a cross-sectional side view of the exemplary substrate structure of FIG. 6 following stripping of a photoresist layer from the structure, in accordance with one embodiment of the invention.

Turning now to FIG. 13, filling of the layered blind hole 18 with solder 60 is illustrated. Various solder compositions as well as methods of solder filling may be utilized, but some methods may be limited to holes of larger diameter or lower aspect ratio. Thus, useful solder-filling methods for the invention may include drag soldering, hot air solder leveling (HASL), chemical vapor deposition (CVD), physical vapor deposition (PVD), electroless deposition and electroplating, depending upon the blind hole dimensions 22, 24 (FIGS. 5 and 6). Suitable solder compositions include, by way of example only, Sn/Pb solders, Sn/Pb/Ag solders, Sn/Pb/Sb solders, Sn/Ag solders, Sn/Sb solders, Au/Sn solders and Sn/Ag/Sb solders, Bi/Sn solders and In/Sn solders. For blind holes 18 of small lateral dimension or width 24, such as less than about 50 μm diameter, an improved wave soldering method may be used to solder-fill the blind holes 18 with solder 60.

According to an improved wave soldering method, molten solder may form a vertical (or near vertical) stream impinging on the openings 32 of the blind holes 18 to be filled. The substrate structure 10 is held by a fixture (not shown) in a vertical, near-vertical (± about 45°), or other orientation (e.g., inverted or substantially horizontal) to be impinged upon by molten solder 60 whereby blind holes 18 are filled. The method is very effective for void-free filling of small blind holes and through holes with solder. This method is described in a co-pending Provisional Patent Application No. 60/606,798, filed Sep. 1, 2004, titled METHODS AND APPARATUS FOR PLACING SUBSTRATES IN CONTACT WITH MOLTEN SOLDER, to Kirby et al., assigned to the assignee of the present invention and in co-pending U.S. patent application Ser. No. 11/140,420, filed May 27, 2005 and claiming the benefit of the referenced provisional patent application, the disclosure of each of which applications is incorporated in its entirety by reference herein. The method may include actions of repositioning the substrate structure 10 in several configurations and reflowing the solder 60 to ensure complete filling of each blind hole 18. Such a method may be very rapid and effective.

Another solder-filling method which may be used is to "shoot" solder balls into the blind hole 18 and then melted to flow. The actions may be repeated as necessary to completely fill the hole. One source of equipment for effecting such a method is available from Pac Tech GmbH of Nauen, Germany. Solder paste has also been used to fill blind holes in the prior art. However, with small diameter blind holes 18, having a diameter<about 50 μm, the use of solder paste may not be generally effective, because its high concentration of flux may cause voids in the TWI 20. Evaporation and electroplating of solder into blind hole 18 are also contemplated as deposition methods suitable for filling blind holes 18. Equipment for performing such methods is available from Silex Microsystems of Jarfalla, Sweden. All of the foregoing examples of solder deposition methods are to be taken as nonlimiting of the scope of the present invention, as other deposition methods and apparatus are also suitable.

Figure 14:
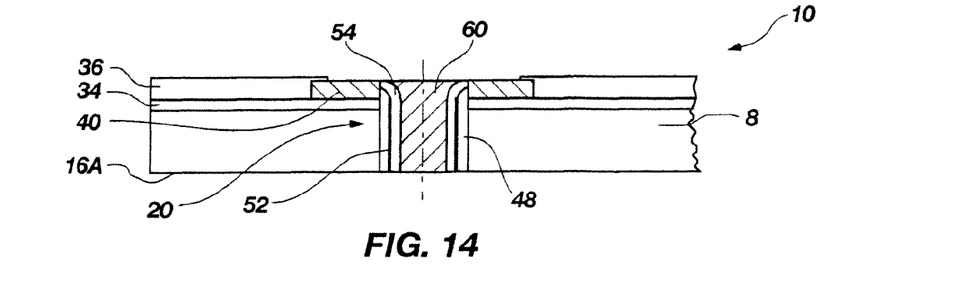
FIG. 14 is a cross-sectional side view of the exemplary substrate structure of FIG. 13 following thinning of the back side to a desired thickness, in accordance with the invention.

Additionally, as shown in FIG. 14, a portion of bulk substrate material 8 may be removed (i.e., thinning) into the second surface 16 to a final second surface 16A at which the desired substrate thickness 12A (see FIG. 2) may be achieved. In one example, bulk substrate material 8 may be removed by an abrasive technique such as back grinding or chemical mechanical planarization (CMP), or as otherwise known in the art. Of course, likewise, passivation layer 48, seed layer 52, and conductive layer 54 and solder 60 may be planarized to exhibit surfaces generally coplanar with the final second surface 16A. For example, a substrate structure 10 having an initial thickness of about 725 μm may be thinned to a final typical thickness of about 250 μm to 150 μm or less. As noted, the planarization or thinning action may be one of back grinding or CMP, by other abrasive techniques, or by wet etching, such methods being well established in the art. As depicted in the figures, the conductive layer 54 (e.g., copper or nickel) may be configured to taper outwardly near the first surface 14 in order to abut the bond pad 40 for electrical contact therewith. In contrast, at the opposite end of the TWI 20 (i.e., at final second surface 16A), each of the passivation layer 48, seed layer 52, and conductive layer 54 may be generally parallel to central axis 50, after thinning (e.g., exposure to CMP or abrasion) and may exhibit substantially coplanar end surfaces.

Figure 15:
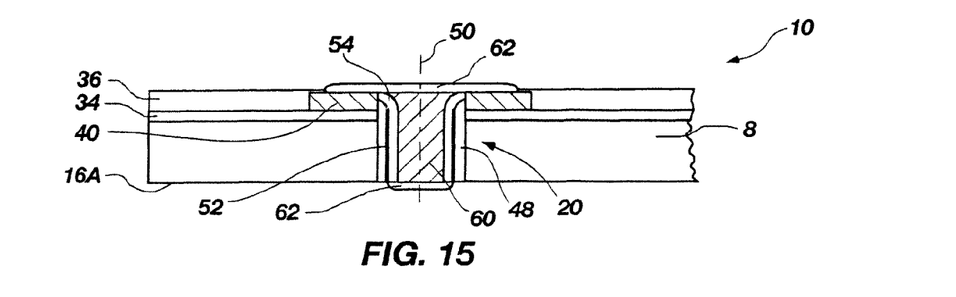
FIG. 15 is a cross-sectional side view of the exemplary substrate structure of FIG. 14 following formation of a plated dam over the solder and metal layer of a TWI to create a capped TWI, in accordance with the invention.
Figure 16:
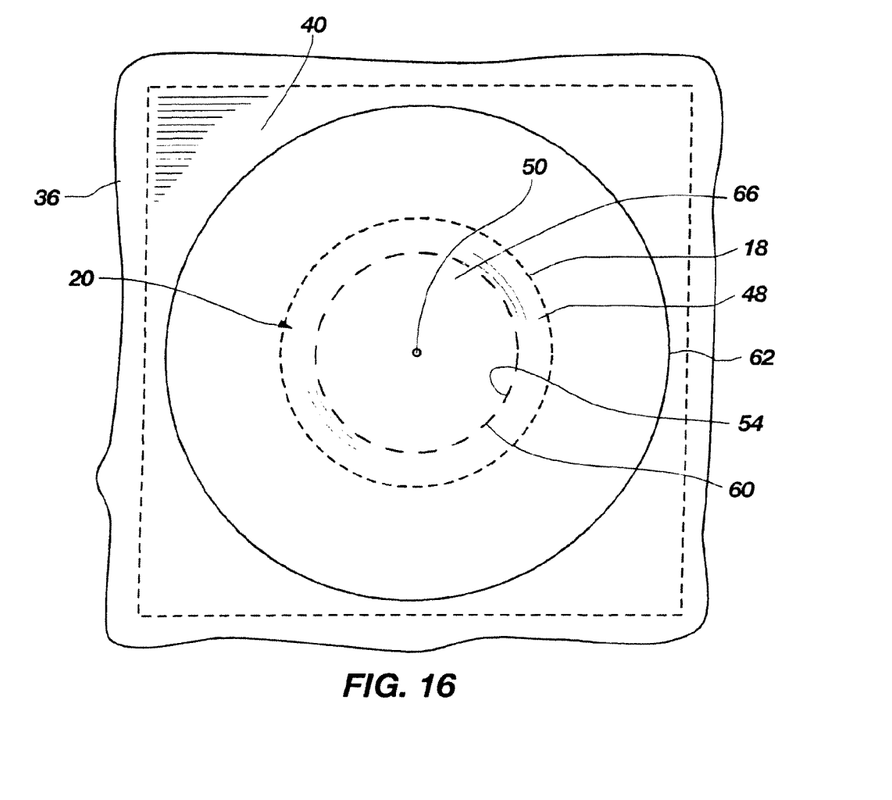
FIG. 16 is an enlarged upper view of an exemplary bond pad and capped TWI of a substrate structure, in accordance with the invention.
Figure 17:
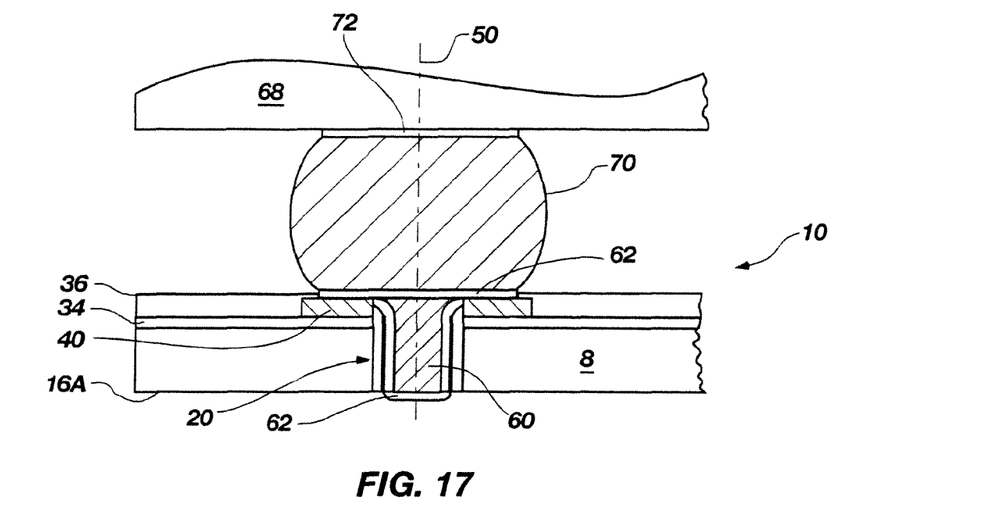
FIG. 17 is a cross-sectional side view of the exemplary substrate structure of FIG. 15 during attachment of another substrate thereto by solder ball, in accordance with the invention.

In a further aspect of the present invention, as pictured in FIGS. 15 and 16, a solder dam or cap 62 may then be applied to one or both ends of the TWI 20. Such a configuration may effectively hold or maintain the solder 60 within the TWI 20. The solder dam or cap 62 may be formed by electroless plating of a layer of metal across the exposed surface of the solder 60 and conductive layer 54. For example, a solder dam 62 may comprise at least one of nickel, copper, rhenium, and gold. The material comprising solder dam 62 must have a glass transition temperature $\psi 2$ greater than the glass transition temperature $\psi 1$ of the solder or must be otherwise formulated and configured so that molten solder will not escape from the TWI 20 during high temperature excursions. The glass transition temperature $\psi 1$ of one commonly employed Pd-free solder is about 217° C. Accordingly, in one embodiment, solder dam 62 may comprise nickel, which exhibits a relatively higher glass transition temperature of about 1455° C. In addition, nickel may be advantageous because it is readily applied by electroless plating to cohere to the cylindrical plated conductive layer 54. The solder dam 62 may prevent removal (e.g., drainage, etc.) of solder from the TWI 20 due to melting of solder 60. Methods for electroless plating of metal such as nickel have been earlier described, above. Nickel has additional advantages over some other metals. For example, copper may form brittle intermetallics with solder, and both rhenium and gold may form intermetallics with solder which result in poor adhesion of the solder dam 62 to the TWI 20.

Where substrate structure 10 is to be joined to attach pads 72 (e.g., ball attach pads) of another, i.e., second substrate 68, as depicted in FIG. 17, the solder dam 62 may serve as a base for solder attachment of solder ball 70. Typically, a solder ball 70 (or array or combination of solder balls or solder material) may be initially attached to at least one of the attach pads 72 of the second substrate 68 and solder dam 62; then, the solder ball 70 may then be attached (by reflowing or other suitable heating process) to the other of the exposed surface 66 (FIG. 16) of a solder dam 62 and the attach pads 72 of second substrate 68 with the solder ball 70. A nickel solder dam or cap 62 having an oxidized surface 66 may be readily cleanable by solder flux applied thereto, or other cleaning processes as known in the art, for providing a wettable surface for solder attachment. Alternatively, of course, a layer of gold may be formed on at least a portion of solder dam 62 for facilitating wetting thereof (as by molten solder) or for preventing oxidation thereof.

In such an application, it should also be noted that solder dam 62 may serve as a barrier to prevent undesirable cross-contamination between dissimilar materials placed on either side thereof For example, it may be desirable that the material of solder ball 70 may differ from that of solder 60 within an underlying TWI 20. In one instance, and by way of example only, solder 60 may comprise an Au/Sn solder, while solder ball 70, placed on and bonded to solder dam 62 by reflow, may comprise a Pb/Sn solder. The glass transition temperature $\psi 2$ of the material of solder dam 62 will, of course, be greater than the glass transition temperature $\psi 1$ of solder 60 as well as the glass transition temperature $\psi_3$ of solder ball 70 in order to maintain the integrity of the barrier. Thus, the respective physical, thermal and electrical characteristics of each different solder material may be readily maintained by solder dam 62.

In another aspect of the invention, not shown, a photolithographic damascene process may be used to electrically connect a solder dam or cap 62 to a surrounding bond pad 40. In the damascene process, a recess may be formed by etching or laser ablation between the solder dam 62 and bond pad 40, and filled with a conductor by, for example, CVD or other deposition method.

Figure 18:
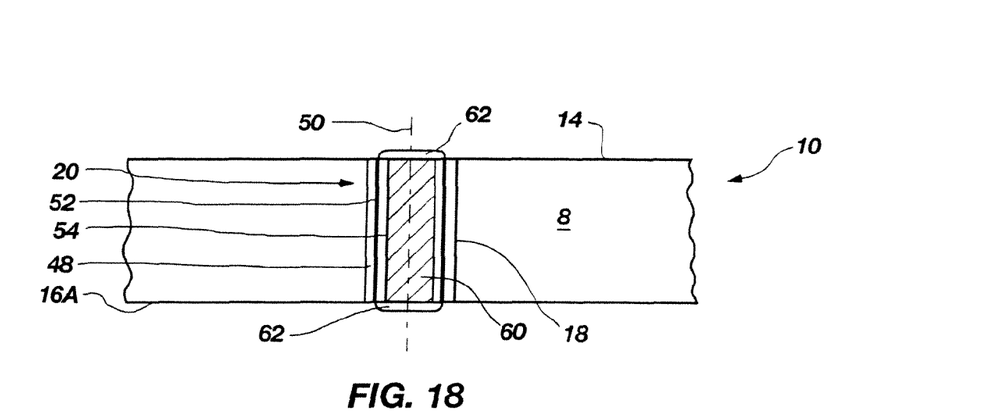
FIG. 18 is a cross-sectional side view of an exemplary substrate with a capped TWI not passing through a bond pad, in accordance with another embodiment of the invention.

In a further aspect of the invention, depicted in FIG. 18, a TWI 20 in a substrate structure 10 without bond pads 40 has a surrounding passivation layer 48 which fully isolates the TWI 20 from the bulk substrate material 8. Solder dams 62, for example, may comprise nickel, which has been electroless plated across the solder 60 and conductive layer 54.

In addition to providing a way of preventing solder loss during elevated temperature excursions during manufacturing operations, the methods of the invention enable avoidance of the use of wire bonding. In addition, the invention enables assembly of stacked dice and multi-chip modules (MCM) at high speed and accuracy while reducing the occurrence of defects. The method is contemplated for and especially suitable to be used at the wafer level, thus saving both manufacturing time and costs, including materials costs.

Figure 19:
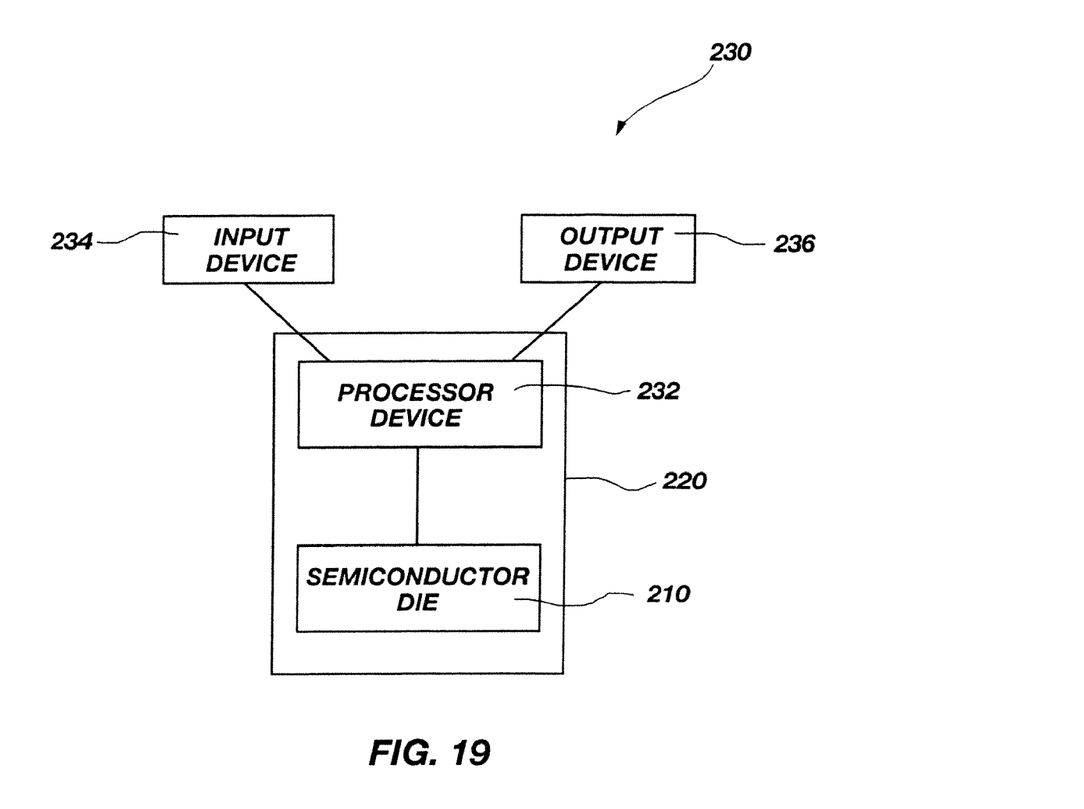
FIG. 19 is a schematic block diagram of an electronic system incorporating structures according to the present invention.

Of course, it should be understood that where a TWI is formed in a substrate comprising a semiconductor wafer having a plurality of semiconductor dice formed thereon or therein, individual semiconductor dice may be separated from one another (i.e., singulated) to form a plurality of individual semiconductor dice. Accordingly, it should be appreciated that at least one semiconductor die (or a device including same) may be fabricated by way of the methods of the present invention. Thus, at least one semiconductor die may include at least one dam structure according to the present invention, as discussed hereinabove. It is further noted that a semiconductor die so formed may be utilized in a computer or other electronic component environment. For example, FIG. 19 shows a schematic block diagram of system 230 incorporating at least one semiconductor die 210 including structures according to the present invention. Semiconductor die 210 may be included in a computing device 220, such as a hand-held computing device, a computer, or another electronic device. The computing device 220 may include a processor device 232, such as a central processing unit or other logic device operably coupled thereto. Semiconductor die 210 may be fabricated from a semiconductor wafer including at least one TWI according to the present invention as described above. Further, processor device 232 may also be coupled with one or more appropriate input devices 234 (e.g., mouse, push-button, touch screen, communication interface, hard drive, etc.) and one or more output devices 236 (e.g., a display, printer, communication interface, hard drive, etc.) within system 230. It is also noted that the semiconductor die 210 may be utilized in various computing environments, systems, and devices, such as, for example, cell phones, personal data assistants (PDAs), and other similar electronic devices.

The present invention has been described in specific embodiments intended in all respects to be illustrative rather than limiting. It is to be understood that the invention defined by the appended claims is not to be limited by specific details set forth in the above description and that alternative embodiments will become apparent to those of ordinary skill in the art to which the invention pertains without departing from the spirit and scope thereof.

What is claimed is:
1. A semiconductor die, comprising:
at least one through via extending from a first surface to a second surface of the semiconductor die, the at least one through via including a solder-wetting metal layer formed over a sidewall thereof and a solder positioned therein;
at least one dam structure disposed over an end of the at least one through via proximate at least one of the first surface and the second surface, the at least one dam structure comprising another conductive material formulated and configured to retain the solder in the at least one through via when the solder is in a molten state; and
at least another dam structure disposed over another end of the at least one through via; and
wherein at least one dam structure is electrically connected to a bond pad disposed on the at least one of the first surface and the second surface of the semiconductor die.

2. The semiconductor die of claim 1, further comprising a conductive ball electrically coupled to the at least one dam structure.

3. The semiconductor die of claim 2, wherein the another conductive material comprising the at least one dam structure has a glass transition temperature which is higher than a glass transition temperature of each of the solder and the conductive ball.

4. An electronic system, comprising a computing device including at least one semiconductor die, the at least one semiconductor die comprising;
at least one through via extending between a first surface and a second surface of the semiconductor die;
a solder-wetting metal layer formed over a sidewall of the at least one through via and a solder positioned therein;
at least one dam structure extending over an end of the at least one through via on at least one of the first surface and the second surface, the at least one dam structure comprising another conductive material formulated and configured to prevent the removal of the at least one conductive material from the at least one through via due to melting of the at least one conductive material; and
at least another dam structure disposed over another end of the at least one through via; and
wherein at least one dam structure is electrically connected to a bond pad disposed on the at least one of the first surface and the second surface of the semiconductor die.

5. The electronic system of claim 4, wherein the another conductive material comprising the at least one dam structure has a glass transition temperature which is higher than a glass transition temperature of the solder.

6. The electronic system of claim 4, wherein the at least one dam structure comprises at least one of nickel, copper and rhenium.

7. The semiconductor die of claim 1, wherein the at least one dam structure comprises a conductive material having a glass transition temperature which is higher than a glass transition temperature of the solder.

8. The semiconductor die of claim 1, wherein the at least one dam structure comprises at least one of nickel, copper and rhenium.

9. The semiconductor die of claim 1, wherein the solder comprises at least one of a Sn/Pb solder, a Sn/Pb/Ag solder, Sn/Pb/Sb solder, Sn/Ag solder, Sn/Sb solder, an Au/Sn solder, a Sn/Ag/Sb solder, a Bi/Sn solder and an In/Sn solder.

10. The semiconductor die of claim 1, wherein the solder-wetting metal layer comprises one of copper and nickel.

* * * * *

UNITED STATES PATENT AND TRADEMARK OFFICE
CERTIFICATE OF CORRECTION

| | | |
|---|---|---|
| PATENT NO. | : 7,833,894 B2 | Page 1 of 1 |
| APPLICATION NO. | : 11/781746 | |
| DATED | : November 16, 2010 | |
| INVENTOR(S) | : W. Mark Hiatt | |

It is certified that error appears in the above-identified patent and that said Letters Patent is hereby corrected as shown below:

In column 14, line 29, in Claim 4, delete "comprising;" and insert -- comprising: --, therefor.

Signed and Sealed this
Fourth Day of January, 2011

David J. Kappos
*Director of the United States Patent and Trademark Office*